(12) United States Patent
Beamish et al.

(10) Patent No.: US 8,126,101 B2
(45) Date of Patent: Feb. 28, 2012

(54) METHOD AND APPARATUS FOR VARYING A DYNAMIC RANGE

(75) Inventors: Norman Beamish, Cork (IE); Alan Bannon, Cork (IE); Anthony Dunne, Carrigaline (IE); Conor O'Keeffe, Cork (IE)

(73) Assignee: Freescale Semiconductor, Inc., Austin, TX (US)

( * ) Notice: Subject to any disclaimer, the term of this patent is extended or adjusted under 35 U.S.C. 154(b) by 307 days.

(21) Appl. No.: 12/532,784

(22) PCT Filed: Mar. 27, 2007

(86) PCT No.: PCT/IB2007/051078
§ 371 (c)(1),
(2), (4) Date: Sep. 23, 2009

(87) PCT Pub. No.: WO2008/117130
PCT Pub. Date: Oct. 2, 2008

(65) Prior Publication Data
US 2010/0086016 A1    Apr. 8, 2010

(51) Int. Cl.
*H04L 7/00* (2006.01)
(52) U.S. Cl. ......... 375/355; 375/316; 375/326; 375/340

(58) Field of Classification Search ............... 375/316, 375/326, 340, 355
See application file for complete search history.

(56) References Cited

U.S. PATENT DOCUMENTS 4,910,752 A   3/1990   Yester, Jr. et al.
(Continued)

FOREIGN PATENT DOCUMENTS

EP   0366025 A2   5/1990
(Continued)

OTHER PUBLICATIONS

International Search Report and Written Opinion correlating to PCT/IB2007/051078 dated Aug. 20, 2007.

*Primary Examiner* — Ted Wang

(57) ABSTRACT

A communications device comprises a receiver for receiving an input signal operably coupled to analogue to digital converter logic. The analogue to digital converter logic is operably coupled to control logic via a signal analyzer arranged to analyze a converted received input signal, output from the analogue to digital converter logic to determine at least one characteristic of the received signal. The control logic is arranged to vary a dynamic range of the analogue to digital converter logic depending on the at least one determined characteristic of the received input signal.

27 Claims, 3 Drawing Sheets

U.S. PATENT DOCUMENTS

| | | | |
|---|---|---|---|
| 5,917,865 A * | 6/1999 | Kopmeiners et al. | 375/345 |
| 6,272,193 B1 * | 8/2001 | Eglit | 375/355 |
| 6,751,249 B1 | 6/2004 | Cannon et al. | |
| 2004/0161062 A1 | 8/2004 | Richey et al. | |

FOREIGN PATENT DOCUMENTS

| | | |
|---|---|---|
| EP | 1303053 A1 | 4/2003 |
| EP | 1655848 A | 5/2006 |
| JP | 2002076891 A | 3/2002 |
| JP | 2006101128 A | 4/2006 |
| WO | 9929130 A | 6/1999 |
| WO | 0019644 A | 4/2000 |
| WO | 0055977 A | 9/2000 |
| WO | 0199444 A1 | 12/2001 |
| WO | 2006043207 A | 4/2006 |

* cited by examiner

METHOD AND APPARATUS FOR VARYING A DYNAMIC RANGE

TECHNICAL FIELD

The invention relates to a method and apparatus for varying a dynamic range of a circuit. In particular, the invention relates to a method and apparatus for varying a dynamic range of an analogue to digital converter circuitry of a receiver circuit of a communications device.

BACKGROUND

In the field of radio frequency (RF) communication, it is increasingly common for RF receivers to comprise complex analogue to digital converter (ADC) circuitry for converting received signals from an analogue format to a digital format. The use of ADCs minimises analogue baseband filtering and enables improved channel selectivity through the use of digital filtering.

For receivers, such as very low intermediate frequency (VLIF) receivers, a dynamic range in excess of 90 dB, i.e. the ADC digital output can faithfully represent input signals which vary in amplitude by up to 90 dB, is generally required.

The need for such a high dynamic range is a relatively recent development, due to RF receivers migrating to deep sub-micron processes and the use of zero intermediate frequency (ZIF) and VLIF receiver architectures, is leading to increased replacement of analogue filtering by digital filtering in the receiver architecture. To take full advantage of digital filtering requires a high dynamic range ADC.

A need to provide a dynamic range in excess of 90 dB arises due to received RF signals being received at a signal strength as low as −110 dBm, when the receiver needs to distinguish the desired received signal from residual noise. Similarly, it is possible, and indeed generally expected, that interference signals in adjacent RF channels can be up to 50 dB higher in energy than the desired signal. Consequently, a high dynamic range of the receiver is necessary in order for the digital filtering in the RF receiver circuitry to be able to remove the interference signal(s), whilst maintaining a sufficient signal to noise ratio (SNR) for the receiver to be able to adequately recover the desired signal.

It is known that providing such a level of dynamic range involves consuming a significant amount of power to operate the complex ADC, with the power consumed by an ADC and its dynamic range being generally monotonically related. As will be appreciated by a skilled artisan, for battery powered devices, high power consumption is undesirable, since it limits the battery life of the device. Nevertheless, as mentioned above, a high dynamic range is required in order for the digital output to faithfully represent a received input signal, in the presence of high power interfering (blocking) signals or when the desired received signal level is at a very low power.

Thus, a need exists for an improved wireless communication device and integrated circuit providing analogue to digital converter functionality.

SUMMARY OF THE INVENTION

In accordance with aspects of the invention, there is provided a communication device and integrated circuit comprising analogue to digital converter circuitry, and a method of varying a dynamic range therefor, as defined in the appended claims.

DETAILED DESCRIPTION

Figure 1:
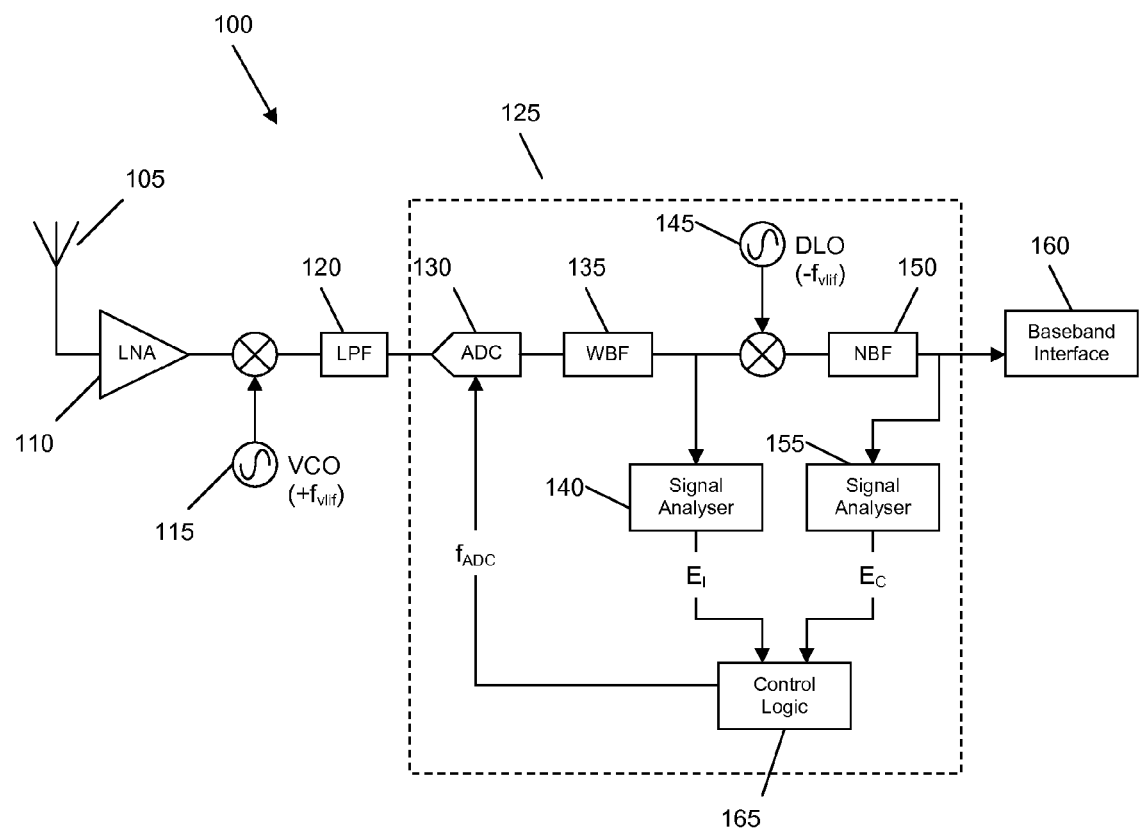
FIG. 1 illustrates radio frequency (RF) receiver circuitry according to an exemplary embodiment of the invention.

Before describing in detail embodiments that are in accordance with the invention, it should be observed that the various apparatus components described herein, and as shown in the accompanying drawings, have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

Referring first to FIG. 1, there is illustrated a radio frequency (RF) receiver 100 of a wireless communication device according to an exemplary embodiment of the invention. RF signals are received by an antenna 105, and amplified by a low noise amplifier (LNA) 110. The received amplified analogue signals are then down-converted to (mixed with) a very low intermediate frequency provided by a voltage controlled oscillator (VCO) 115 operating at an offset frequency of '+$f_{vlif}$'. In this manner, the VCO is programmed to an RF channel frequency and the offset is then added to this value to determine the frequency at which the VCO will oscillate. The mixed analogue signal is then filtered by a low pass filter (LPF) 120, before being input to analogue to digital converter circuitry 125.

For the illustrated embodiment, the analogue to digital converter circuitry 125 comprises an analogue to digital converter (ADC) logic 130, a wide band filter 135, a digital local oscillator (DLO) 145 and a narrow band filter 150.

Received analogue signals are converted into digital signals by the ADC logic 130. The digital signals are then filtered by the wide band filter 135, before being down-mixed with an inverse representation of the very low intermediate frequency (−$f_{vlif}$), provided by the DLO 145. Finally, the digital signal is filtered by the narrow band filter 150, before being provided to a baseband interface 160 of a host device of which the receiver 100 forms a part. The wide band filter 135 is typically used to facilitate the conversion of the received digital signal from the high sampling rate used at the output of the ADC logic 130 to a lower sampling rate where further computational operations may be carried out more economically. The wide band filter 135 removes out-of-band quantisation noise resulting from the analogue to digital conversion process, and also provides some out-of-band interference attenuation. The wide band filter 135 also typically provides a decimation function. The narrow band filter 150 is used to remove received energy other than that of the desired signal band.

For the illustrated embodiment, the ADC logic 130 is a sigma-delta ADC adapted to perform oversampling, quantisation noise filtering and digital and decimation filtering. Sigma-delta ADCs are well known in the art, as are the concepts of oversampling, quantisation noise filtering and digital and decimation filtering. As such, they will not be described in further detail herein.

In accordance with the invention, the analogue to digital circuitry 125 further comprises circuitry to facilitate operation over a variable dynamic range. In this manner, the analogue to digital circuitry 125 is capable of providing a higher dynamic range, for example in excess of 90 dB, which is advantageous when received RF signals comprise a low signal strength, or when blocking signals in RF channels (adjacent to the desired channel) are present. Conversely, when no blocking signals are present, and received RF signals comprise a suitable signal strength, the analogue to digital circuitry 125 is capable of providing a reduced dynamic range, advantageously reducing the power consumption of the analogue to digital circuitry 125.

For the illustrated embodiment, the analogue to digital circuitry 125 comprises control logic 165, operably coupled to the ADC logic 130, which provides, inter-alia, sampling frequency parameters ($f_{ADC}$) to the ADC logic 130. In this manner, the control logic 165 is arranged to vary the sampling frequency of the ADC logic 130. As a consequence of varying the sampling frequency of the ADC logic 130, the dynamic range of the ADC logic 130 is also varied.

In an exemplary embodiment, the sampling frequency parameters ($f_{ADC}$) provided to the ADC logic 130 by the control logic 165 may further comprise decimation parameters. In this manner, the decimation filtering performed by the ADC logic 130 may also be varied along with the sampling frequency. Consequently, the decimation filtering may be varied along with the sampling frequency in such a manner as to maintain a uniform signal data rate at an output of the ADC logic 130.

The control logic 165 is coupled to the ADC logic 130 via a signal analyser 140, which for the illustrated embodiment is in turn coupled to the output of the wide band filter 135 to sample an output signal therefrom. The signal analyser 140 analyses the output signal of the ADC logic 130, following wide band filtering for the illustrated embodiment, and determines at least one characteristic of the received signal, such as the energy level of the received signal. The at least one signal characteristic is then passed to the control logic 165.

The at least one signal characteristic enables the control logic 165 to determine whether the ADC logic 130 requires a high dynamic range in order for the output of the ADC logic 130 to faithfully represent desired input signals.

For the illustrated embodiment, the signal analyser 140 measures the energy of the ADC logic 130 output signal, and passes this data to the control logic 165. In this manner, the control logic 165 is able to determine a signal-to-interference (C/I) ratio of the desired signal. A high C/I ratio would indicate that a large blocking signal was present, and as such a high dynamic range would be required. The control logic 165 is able to configure the ADC logic 130 accordingly, by way of the frequency parameters ($f_{ADC}$).

By way of example, the C/I ratio may be determined by comparing the wide band energy ($E_I$) measured at the output of the ADC logic 130 with the narrow band energy ($E_c$) measured at the output of the narrow band filter 150. If $E_c \ll E_I$ then this suggests that there is a large amount of out-of-band energy due to a blocking signal, since the narrow band filter 150 has removed a large amount of energy. Consequently, a high dynamic range is required. If $E_c \approx E_I$ then the narrowband filter has not removed much energy, which suggests that no blocking signals are present. Consequently, if the received signal energy is large enough, a high dynamic range is not required.

Accordingly, for the exemplary embodiment illustrated in FIG. 1, the control logic 165 is further coupled to a second signal analyser 155, which in turn is coupled to an output of the narrow band filter 150. The second signal analyser 155 may, in some embodiments, be distinct from or part of the first signal analyser 140. In some embodiments, both the output of the ADC logic 130 and the output of the narrow band filter 150 may be analysed in a single signal analyser arranged to analyse a relatively wide band input signal covering both signals, or to separately analyse both signals. Thus, the second signal analyser 155 analyses an output of the narrow band filter 150 and obtains signal characteristics therefrom.

For the illustrated embodiment, the second signal analyser 155 measures an energy of the narrow band filter 150 output signal, and passes this to the control logic 165. As will be appreciated by a skilled artisan, the energy of the output signal of the narrow band filter 150 represents the energy of a received signal. In this manner, the control logic 165 is able to determine the energy level of the received signal. Where a received signal comprises a low energy level, a high dynamic range of the analyser is required to correctly identify the desired signal from noise. In response thereto, the control logic 165 is able to configure the ADC logic 130 accordingly, by way of the frequency parameters ($f_{ADC}$).

For the exemplary embodiment illustrated in FIG. 1, two discrete signal analysers 140, 155 are illustrated. However, it will be appreciated by a skilled artisan that the inventive concept is equally applicable where the exemplary embodiment illustrated comprises a single signal analyser component for analysing either one of the signals or indeed both signals, namely the output signal of the ADC logic 130 or the output signal of the narrow band filter 150. Alternatively, it is envisaged the control logic 165 may perform the analysis of the signal(s) itself.

In an exemplary embodiment of the invention, the RF receiver 100 is adapted to function in a first, high dynamic range state, and a second, reduced dynamic range state. For the illustrated embodiment, where the C/I ratio indicates a large blocking signal, and/or the received signal energy is below a threshold, e.g. close to sensitivity levels of the receiver, the control logic 165 configures the ADC logic 130 to operate in the first state, providing a high dynamic range.

Conversely, where the C/I ratio indicates no blocking signal, and the received signal energy is above the threshold, the control logic 165 configures the ADC logic 130 to operate in the second state, reducing the dynamic range and thereby reducing the power consumption of the ADC logic 130.

As will be appreciated by a skilled artisan, it is often the case that the received RF signals are in the form of signal bursts. As such, the RF receiver 100 is unlikely to be able to determine the input signal characteristics and switch states during a burst. Consequently, in an exemplary embodiment of the present invention, upon receipt of a signal burst, the control logic 165 determines the signal characteristics of that received burst, and determines the appropriate state. The control logic 165 is then able to store the required state settings, and subsequently apply them for the next burst received, or alternatively to set the ADC logic 130 to operate in the required state for the next burst once the current burst has finished.

In this manner, upon receipt of a signal burst, the RF receiver 100 comprises logic to store prior knowledge of the appropriate dynamic range, due to the characteristics of the previous burst.

In a case where the RF receiver 100 supports frequency hopping, the state settings can be stored along with ARFCN (Absolute Radio Frequency Channel Number) parameters. In this way, different state settings are stored for the different frequency channels, depending on the signal characteristics for each channel.

For the embodiment illustrated in FIG. 1, the functional elements of the analogue to RF receiver 100, and in particular the analogue to digital converter circuitry 125, are illustrated by way of discrete components. However, it will be appreciated by a skilled artisan that some or all of these components may be integrated into one or more integrated circuit (IC) packages.

Figure 2:
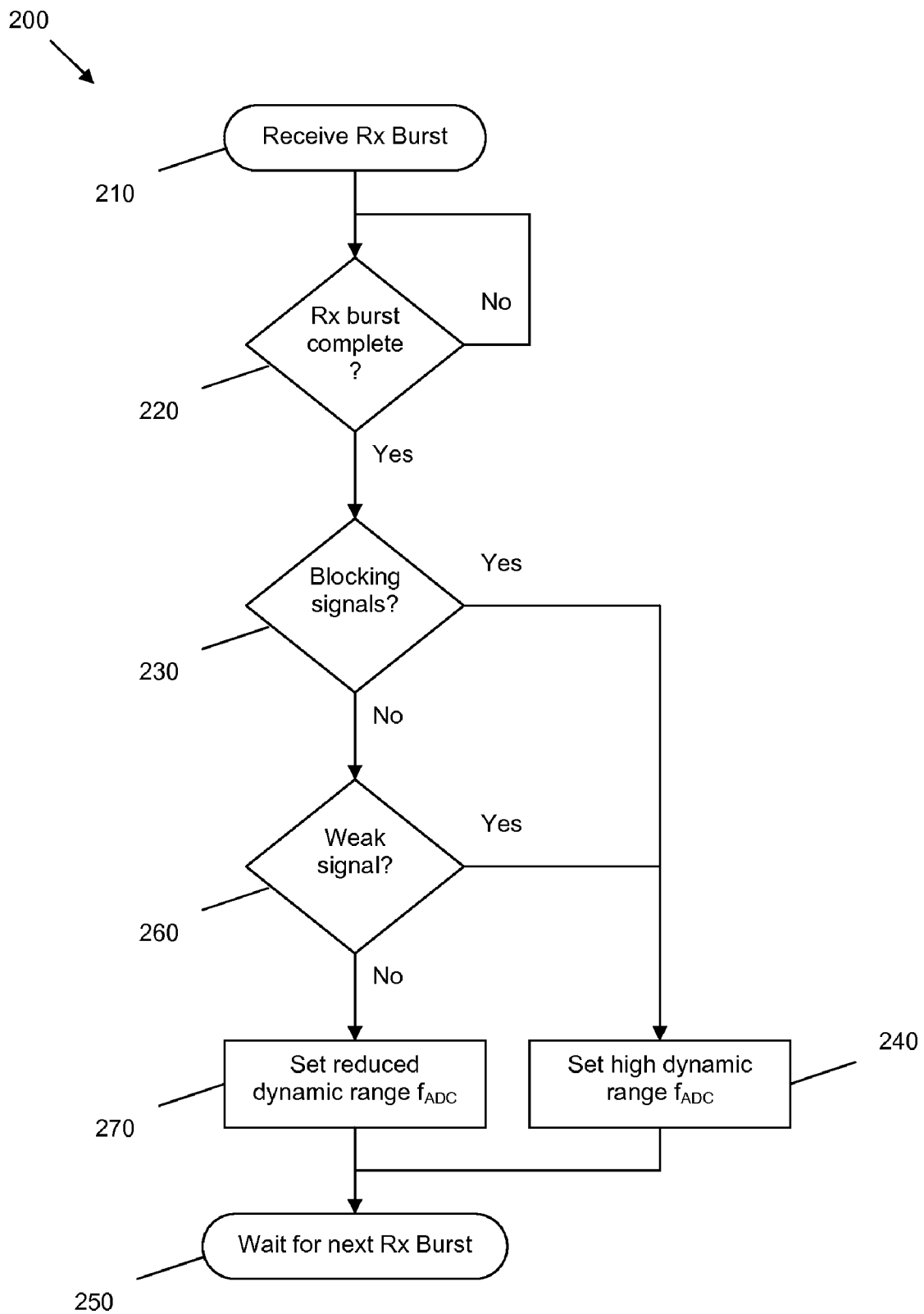
FIG. 2 illustrates a method of varying a dynamic range of radio frequency (RF) receiver circuitry in accordance with an exemplary embodiment of the invention.

Referring now to FIG. 2, there is illustrated a flowchart of a method 200 of varying/adapting a dynamic range of radio frequency (RF) receiver circuitry in accordance with an exemplary embodiment of the invention.

The method 200 starts at step 210 with the receipt of a signal, which for the illustrated embodiment is in the form of a signal burst. In step 220, the method waits until the signal burst has been completely received before moving on to step 230, after which it is determined whether any blocking signals are present within the burst.

It will be appreciated by a skilled artisan that the method 200 may equally be applied to continuous received signals, as opposed to received signals comprising bursts. In the case of a continuous received signal, step 220 may wait for a predetermined period of time over which measurements, as described below, may be made.

As previously mentioned, in relation to the exemplary embodiment illustrated in FIG. 1, blocking signals may be identified, by measuring the energy of the output signal of the ADC logic 130, in order to determine the C/I ratio.

If blocking signals are present, a high dynamic range is required in order for the input signal to be faithfully represented. Thus, the method moves on to step 240, where the $f_{ADC}$ (FIG. 1) is set to configure the ADC logic 130 for a high dynamic range. The method then ends at step 250, and waits for the next signal burst.

Referring back to step 230, if no blocking signals are present, the method moves on to step 260, where it is determined whether the received signal is relatively weak, for example below a predetermined threshold. As previously mentioned in relation to the exemplary embodiment illustrated in FIG. 1, the signal strength of the received signal can be determined by measuring the energy of the output signal from the narrow band filter 150.

The threshold used to determine a weak received signal may depend upon the performance of the ADC logic 130 in high and low dynamic range modes. For example, if a signal to noise ration (SNR) of 10 dB is required to receive the signal, and the ADC logic 130 operating in a high dynamic range mode provides 30 dB for a specific signal, whilst in a low dynamic range mode provides 15 dB, then the low dynamic range mode would be selected for that signal. However, if the required SNR to receive the signal is 25 dB then the high dynamic range mode would be selected for that signal.

If the received signal is weak, the control logic 165 determines that a high dynamic range is required. Thus, in this instance the method 200 moves on to step 240, where the $f_{ADC}$ (FIG. 1) is set to configure the ADC logic 130 for a high dynamic range. The method then ends at step 250, and waits for the next signal burst.

Referring back to step 260, if the received signal is not relatively weak, and as determined in step 230 no blocking signals are present, a high dynamic range is not necessary. Thus, the method moves on to step 270, where the $f_{ADC}$ (FIG. 1) is set to configure the ADC logic 130 for a reduced dynamic range. In this manner, the power consumption of the RF receiver 100 is advantageously reduced. The method then ends at step 250, and waits for the next signal burst.

Figure 3:
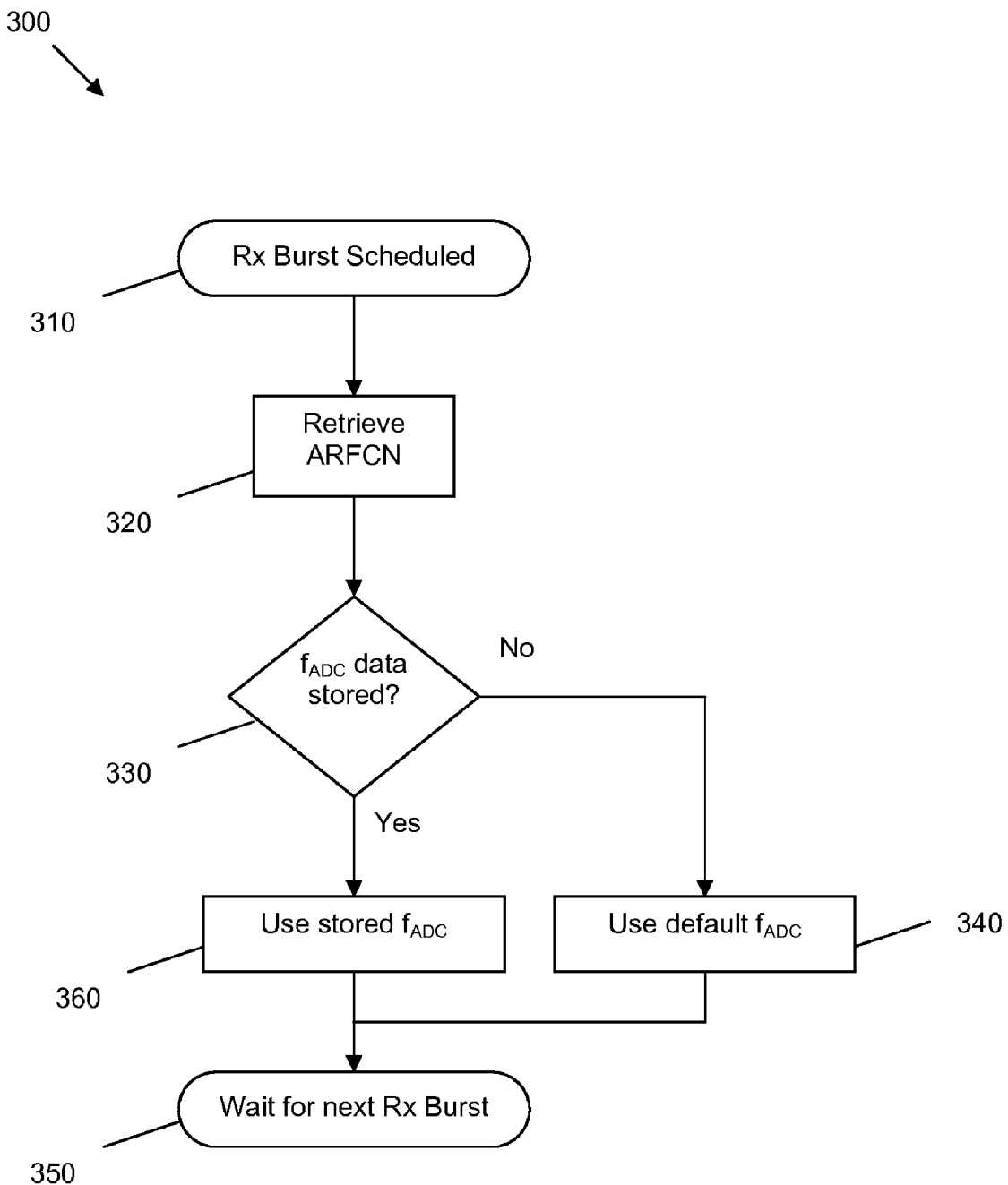
FIG. 3 illustrates a method of varying a dynamic range of radio frequency (RF) receiver circuitry in accordance with an alternative exemplary embodiment of the invention.

Referring now to FIG. 3, there is illustrated a flowchart of a method 300 of varying/adapting a dynamic range of radio frequency (RF) receiver circuitry, in accordance with an alternative exemplary embodiment of the invention.

The method starts at step 310, with the receipt of a scheduled signal burst. For the embodiment of FIG. 3, frequency hopping is employed. As such, a next step 320 comprises retrieving ARFCN parameters.

As previously mentioned, in an exemplary embodiment of the invention, the dynamic range settings may be stored along with the ARFCN parameters. By way of example, dynamic range settings may be stored for each channel. Thus, in step 330, it is determined whether dynamic range settings, e.g. $f_{ADC}$ data, are stored with the ARFCN parameters for the relevant channel.

If dynamic range settings are not stored, the method moves to step 340, where default dynamic range settings are used to configure the RF receiver circuitry. For example, the default dynamic range settings may be used to support a high dynamic range. In this manner, the input signal can be faithfully represented, even if blocking signals are present, or the received input signal is perceived as relatively weak. The method then ends at step 350, and the process waits for the next signal burst.

Referring back to step 330, if dynamic range settings are stored, the stored settings are used to configure the RF receiver circuitry. In one embodiment of the invention, the stored settings may have been stored following execution of the method of FIG. 2 upon receipt of a previous signal burst. The method then ends at step 350, and the process waits for the next signal burst.

In an exemplary embodiment of the invention, the method illustrated in FIG. 3 substantially incorporates the method of FIG. 2. For example, following implementing the dynamic range settings, whether in step 340 or in step 360, the method may move to a step corresponding to step 220 of the method of FIG. 2, to await the completion of the signal burst.

Subsequently, the method of FIG. 3 may then substantially follow the steps of the method in FIG. 2, in order to determine appropriate settings for the received signal. In this manner, where dynamic range settings were not previously stored, appropriate settings can be determined and stored for future bursts. Conversely, where dynamic range settings were previously stored, the method of FIG. 3 provides for updating of the settings should the situation change.

For the various embodiments described herein, and illustrated in the accompanying drawings, the invention has been described in relation to varying/adapting a dynamic range between a high dynamic range setting and a reduced dynamic range setting. However, it will be appreciated by a skilled artisan that the invention is not limited to comprising two discrete settings, between which the RF receiver circuitry may vary. In particular, an RF circuitry receiver adapted to implement the invention may alternatively be capable of three or more discrete dynamic range settings, or alternatively arranged to support a substantially continuous range of dynamic range settings.

It will be understood that the radio frequency receiver circuitry, analogue to digital circuitry and method of varying a dynamic range therein, as described above, aim to provide at least an advantage of reducing power consumption when a high dynamic range is not necessary, and enabling a high dynamic range to be provided when required. In this manner, extended battery life and/or standby time of a communications device may be achieved, when the communication device comprises radio frequency receiver circuitry and/or analogue to digital circuitry embodying the inventive concepts, or adapted to implement the method of varying a dynamic range according to the invention, for example.

Examples of such a communication device include, by way of example only, portable radio handsets, mobile telephone handsets, etc.

It will be appreciated that any suitable distribution of functionality between different functional units or controllers or memory elements, may be used without detracting from the inventive concept herein described. Hence, references to specific functional devices or elements are only to be seen as references to suitable means for providing the described functionality, rather than indicative of a strict logical or physical structure or organization.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second' etc., do not preclude a plurality.

Thus, an improved radio frequency receiver circuitry, analogue to digital circuitry and method of varying a dynamic range therein have been described, where the aforementioned disadvantages with prior art arrangements have been substantially alleviated.

The invention claimed is:

1. A communications device comprises:
analogue to digital converter logic;
a receiver for receiving an input signal operably coupled to the analogue to digital converter logic;
wherein the analogue to digital converter logic is operably coupled to control logic via a signal analyser arranged to analyse a converted received input signal, output from the analogue to digital converter logic, to determine at least one characteristic of the received input signal; and
logic to store prior knowledge of an appropriate dynamic range of the analogue to digital converter logic for different frequency channels and wherein the control logic is arranged to vary a dynamic range of the analogue to digital converter logic depending on the at least one determined characteristic of the received input signal and prior knowledge of a relevant frequency channel.

2. The communications device of claim 1 wherein the control logic:
provides sampling frequency parameters to the analogue to digital converter logic; and
the control logic varies the dynamic range of the analogue to digital converter logic by varying the sampling frequency parameters.

3. The communications device of claim 2 wherein the sampling frequency parameters further comprise decimation parameters.

4. The communications device of claim 2 wherein the analogue to digital converter logic comprises a sigma-delta analogue to digital converter.

5. The communications device of claim 2 wherein the control logic varies the dynamic range of the analogue to digital converter logic depending on one or both of the following characteristics of the received input signal:
(i) a signal-to-interference ratio; and/or
(ii) a signal strength of the received input signal.

6. The communications device of claim 5 wherein the control logic varies the dynamic range of the analogue to digital converter logic depending on a required signal to noise ratio (SNR) of the received input signal.

7. The communications device of claim 5 wherein the analogue to digital converter logic is adapted to function in a first, high dynamic range state, or a second, reduced dynamic range state, depending on the at least one determined characteristic.

8. The communications device of claim 7 wherein the at least one determined characteristic of the received input signal indicates a blocking signal, and/or the received signal energy is below a threshold, the control logic configures the analogue to digital converter logic to operate in the first state.

9. The communications device of claim 7 wherein, upon receipt of a signal burst, the control logic:
determines at least one signal characteristic of that received input signal burst;
determines a dynamic range setting; and
stores the dynamic range setting to be applied to a subsequent received burst.

10. An integrated circuit comprising:
analogue to digital converter logic operably coupled to control logic via a signal analyser arranged to analyse a converted received input signal, output from the analogue to digital converter logic to determine at least one characteristic of the received signal; and
logic to store prior knowledge of an appropriate dynamic range of the analogue to digital converter logic for different frequency channels and wherein the control logic is arranged to vary a dynamic range of the analogue to digital converter logic depending on the at least one determined characteristic of the received input signal and prior knowledge of a relevant frequency channel.

11. The integrated circuit of claim 10 wherein the control logic:
provides sampling frequency parameters to the analogue to digital converter logic; and
varies the dynamic range of the analogue to digital converter logic by varying the sampling frequency parameters.

12. The integrated circuit of claim 11 wherein the sampling frequency parameters further comprise decimation parameters.

13. The integrated circuit of claim 11 wherein the analogue to digital converter logic comprises a sigma-delta analogue to digital converter.

14. The integrated circuit claims 11 wherein the control logic varies the dynamic range of the analogue to digital converter logic depending on one or both of the following characteristics of the received input signal:
(i) a signal-to-interference ratio; and/or
(ii) a signal strength of the received input signal.

15. The integrated circuit of claim 14 wherein the control logic varies the dynamic range of the analogue to digital converter logic depending on a required signal to noise ratio (SNR) of the received input signal.

16. The integrated circuit of claims 11 to wherein the analogue to digital converter logic is adapted to function in a first, high dynamic range state, or a second, reduced dynamic range state, depending on the at least one determined characteristic.

17. The integrated circuit of claim 16 wherein the at least one determined characteristic of the received input signal indicates a blocking signal, and/or the received signal energy is below a threshold, the control logic configures the analogue to digital converter logic to operate in the first state.

18. The integrated circuit of claims 11, wherein upon receipt of a signal burst, the control logic:
determines at least one signal characteristic of that received input signal burst;
determines a dynamic range setting; and
stores the dynamic range setting to be applied to a subsequent received burst.

19. The integrated circuit of claim 18 wherein the dynamic range setting is stored with Absolute Radio Frequency Channel Number parameters.

20. A method of varying a dynamic range of radio frequency (RF) receiver circuitry comprising analogue to digital converter logic, the method comprising the steps of:
receiving a signal;
analysing the received signal to determine at least one characteristic of the receive signal;
varying a dynamic range of the analogue to digital converter logic depending on the at least one determined characteristic of the received signal and prior knowledge of an appropriate dynamic range of the analogue to digital converter logic for different frequency channels.

21. The method of claim 20 wherein the step of varying the dynamic range comprises varying sampling frequency parameters.

22. The method of claim 21 wherein the step of varying the dynamic range further comprises varying decimation parameters.

23. The method of claim 20 wherein the step of analysing the received signal comprises analysing one or both of the following characteristics of the received signal:
(i) a signal-to-interference ratio; and/or
(ii) a signal strength of the received signal.

24. The method of claim 23 further characterised in that the step of analysing the received signal comprises analysing a required signal to noise ratio (SNR) of the received signal.

25. The method of claim 20 wherein the dynamic range is varied between a high dynamic range and a reduced dynamic range.

26. The method of claim 25 wherein the at least one determined characteristic of the received signal indicates a blocking signal, and/or the received signal energy is below a threshold, the dynamic range is set to a high dynamic range.

27. The method of claims 20, wherein upon receipt of a signal burst, at least one signal characteristic of that received burst is determined; a dynamic range setting is determined; and the required dynamic range setting is stored for application to a subsequent received burst.

* * * * *